United States Patent [19]

Bird

[11] 3,783,408

[45] Jan. 1, 1974

[54] LOW FREQUENCY OSCILLATOR CIRCUIT

[75] Inventor: David A. Bird, Phoenix, Ariz.

[73] Assignee: Honeywell Information Systems Inc., Waltham, Mass.

[22] Filed: June 30, 1972

[21] Appl. No.: 267,828

[52] U.S. Cl. .............................. 331/135, 331/108 D
[51] Int. Cl. .............................................. H03b 5/20
[58] Field of Search .................. 331/108.4, 135, 136

[56] References Cited

UNITED STATES PATENTS 3,008,094 11/1961 Trimmer ............................ 331/136
3,581,238 5/1971 Shimemura et al. ................ 331/136

*Primary Examiner*—John Kominski
*Attorney*—Lloyd B. Guernsey et al.

[57] ABSTRACT

First, second and third inverting amplifiers and a pair of integrators are connected to form an RC oscillator circuit which uses field effect transistors to switch the value of the resistors that determine the frequency of oscillation of the circuit. The circuit uses limiter networks to regulate the amplitude of the signal being generated and to prevent distortion of the signal.

10 Claims, 4 Drawing Figures

LOW FREQUENCY OSCILLATOR CIRCUIT

BACKGROUND OF THE INVENTION

This invention relates to low frequency oscillator circuits and more particularly to an RC oscillator circuit which uses limiter networks to regulate the amplitude of the signal being generated and to prevent distortion of the output signal. The invention also uses field effect transistors to switch in resistors which determine the frequency of oscillation of the circuit.

A wide variety of RC oscillators such as the Wien bridge, phase shift and twin T types of oscillators are used in the prior art circuits to generate low frequency signals. These oscillators use resistors and capacitors to provide feedback to a plurality of inverting amplifiers thereby causing the circuit to oscillate. The values of these resistors and capacitors are changed to cause a change in the frequency of the signal being generated. Since the reactance of the capacitors change as frequency changes the amount of feedback and the amplitude of the generated signal changes with a change in frequency in the prior art oscillator circuits. The amplifiers usd in the prior art oscillators are driven into saturation by signals in the feedback portion of the circuit. The saturated amplifiers cause distortion of the generated signal and produce harmonics of the generated signal. It is necessary for these prior art oscillator circuits to include additional complex circuitry or use the devices such as light bulbs or varistors to aid in reducing the harmonic content of the signal.

The present invention alleviates the disadvantages of the prior art by providing a low frequency oscillator circuit having a controlled amount of regeneration or a controlled amount of degeneration so that the harmonic content of the output signal is low. The controlled value of regeneration and degeneration also causes the amplitude of the output signal to be substantially constant over a wide range of audio frequencies. The present invention is especially adapted for use as a low frequency generator in test equipment or to develop audio frequencies for use in data communication over the nation's telephone system. Field effect transistors can be used to switch additional resistors into and out of the circuit to cause the oscillator to quickly change from one frequency to another frequency.

It is, therefore, an object of this invention to provide a new and improved low frequency oscillator circuit.

Another object of this invention is to provide a low frequency oscillator circuit having means for tuning over a wide range of frequencies without changing the amplitude of the signal generated.

A further object of this invention is to provide a low frequency oscillator circuit which develops signals having a low harmonic content.

Still another object of this invention is to provide a low frequency oscillator circuit which can quickly switch the frequency of the developed signals.

A still further object of this invention is to provide a low frequency oscillator circuit which can quickly switch the frequency of the developed signals without adding excessive harmonic content to the signals.

SUMMARY OF THE INVENTION

The foregoing objects are achieved in the present invention by providing a low frequency oscillator having a controlled amount of regeneration and a controlled amount of degeneration. When the amplitude of the output signal increases to a predetermined value the amount of degeneration is increased so that the amplitude of the output signal remains relatively constant. The controlled amount of regeneration and degeneration also cause the harmonic content of the developed signal to be relatively low.

Other objects and advantages of this invention will become apparent from the following description when taken in connection with the accompanying drawings.

Figure 1:
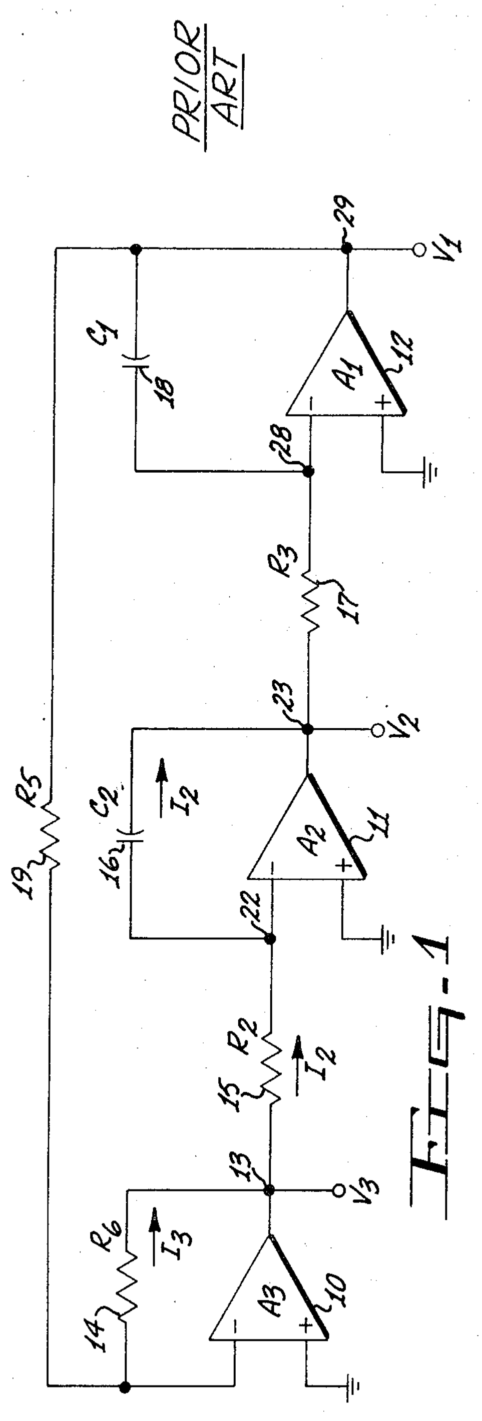
FIG. 1 is a diagram of a prior art RC oscillator which is useful in explaining the operation of the present invention.

The prior art RC oscillator shown in FIG. 1 employs a plurality of high gain amplifiers 10-12, a pair of feedback resistors 14 and 19, and a pair of integrator circuits. The integrator circuits include resistors 15 and 17 and capacitors 16 and 18. Each of the amplifiers has a non-inverting input lead, an inverting input lead and an output lead. Since the details of the operation of the circuit of FIG. 1 are relatively well known in the art most of the details will be omitted from this description. Even though the details of the prior art will be eliminated a basic description of the circuit shown in FIG. 1 will be given to enable one skilled in the art to understand the environment in which the present invention is placed. Accordingly, a derivation of the basic equations which pertain to the circuit of FIG. 1 will be given. Reference letters have been added to this circuit to simplify the derivation of the basic equations.

If the amplifiers 10-12 of FIG. 1 each have a high input impedance and a high gain the current into the input lead of each amplifier will have a value near zero and the voltage at the input lead of each amplifier will have a value near zero.

Then $$I_2 = V_3/R_2\ ,\ V_2 = -I_2\, Z_c = -\ V_3/R_2 \cdot 1/\omega C_2$$

$$V_2 = -V_3\ 1/\omega R_2C_2\ ,\ -\ V_2\omega R_2C_2 = V_3$$

$$V_3 = -\omega R_2C_2V_2\ ,\ V_2 = -\ \omega R_3C_1V_1\ ,\ V_1 = I_3R_5$$

$$I_3 = V_3/R_6\ ,\ V_1 = -\ R_5/R_6\ V_3\ ,$$

substituting we have:

$$V_3 = \omega^2R_2C_2R_3C_1V_1 = -\omega^2R_2C_2R_3C_1R_5/R_6\ V_3$$

so that $$\omega_o = \sqrt{R_6/C_1C_2R_2R_3R_5}$$

Resistor 15 and capacitor 16 form an integrator between junction points 13 and 23 to provide a 90° phase shift in the signal. Resistor 17 and capacitor 18 provide an additional 90° phase shift in the circuit. Each of the amplifiers 10, 11 and 12 provide an additional 180° phase shift so that the total phase shift around the complete loop of the circuit totals 720° thereby causing the circuit to oscillate. The amplitude of the signal fed around the complete loop varies as the frequency of the signal varies. Only the one frequency which is obtained in the above equation provides the correct amplitude to cause the circuit to oscillate. The amplitude of the oscillation in the circuit is limited by the amplifiers 10, 11 and 12 which saturate when the signal reaches a predetermined amplitude. The saturated amplifiers cause harmonics to be generated which may not be desirable. Saturation of the amplifiers can be eliminated by introducing degenerative feedback into the circuit by connecting a resistive component between points 28 and 29 or between points 22 and 23. This degenerative feedback limits the amplitude of the developed signal; however, if too much feedback is introduced the circuit will fail to oscillate. What is needed is a controlled amount of feedback with the degenerative feedback being inoperative when the signal has relatively a low amplitude but the degenerative feedback operating when the signal reaches a predetermined amplitude. Degenerative feedback can also be obtained by connecting a resistor between a junction point 23 and the positive lead of amplifier 10 with the positive lead being ungrounded. If the gain of the amplifiers is insufficient to cause the circuit of FIG. 1 to oscillate at the desired frequency, additional feedback can be obtained by connecting a resistive element between junction points 13 and 28.

Figure 2:
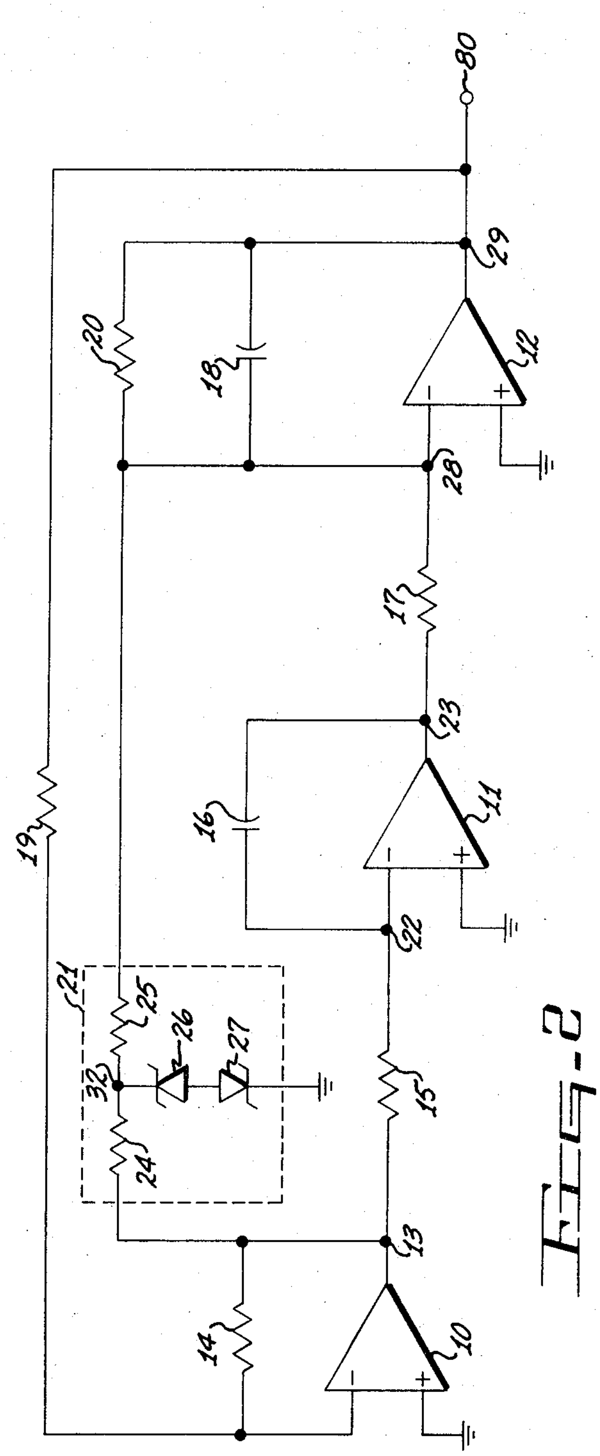
FIG. 2 is the circuit diagram of one embodiment of the present invention.

The low frequency oscillator shown in FIG. 2 includes means for controlling the amount of feedback in the circuit so that the harmonics which are developed in the circuit of FIG. 1 will be reduced. The means for reducing the harmonics include a degenerative feedback resistor 20 which is connected between junction points 28 and 29 and a regenerative feedback circuit 21 which is connected between junction points 13 and 28. Resistor 20 provides a constant amount of degenerative feedback between junction points 29 and 28. The regenerative feedback circuit 21 provides regenerative feedback between points 28 and 13 until the amplitude of the developed signal reaches a predetermined value, then the amount of feedback is reduced to prevent the development of harmonics in the signal. When the amplitude of the developed signal at junction point 28 is less than a predetermined threshold value the voltage is coupled from junction point 28 through resistors 25 and 24 to junction 13 thereby providing regeneration. The voltage at junction points 13 and 32 increases until the voltage at junction point 32 reaches a predetermined value. When the voltage at junction point 32 reaches this predetermined value the zener diodes 26 and 27 are rendered conductive to provide a low impedance between junction point 32 and ground. This low impedance limits the amplitude of the voltage at junction point 32, thereby limiting the amplitude of the signal developed by the oscillator circuit shown in FIG. 2. The circuit connections of zener diodes 26 and 27 in FIG. 2 may be reversed and the circuit will function in the same manner. The anode of zener diode 26 may be connected to junction point 32, the cathode of zener diode 26 may be connected to the cathode of zener diode 27 and the anode of zener diode 27 connected to ground.

Figure 3:
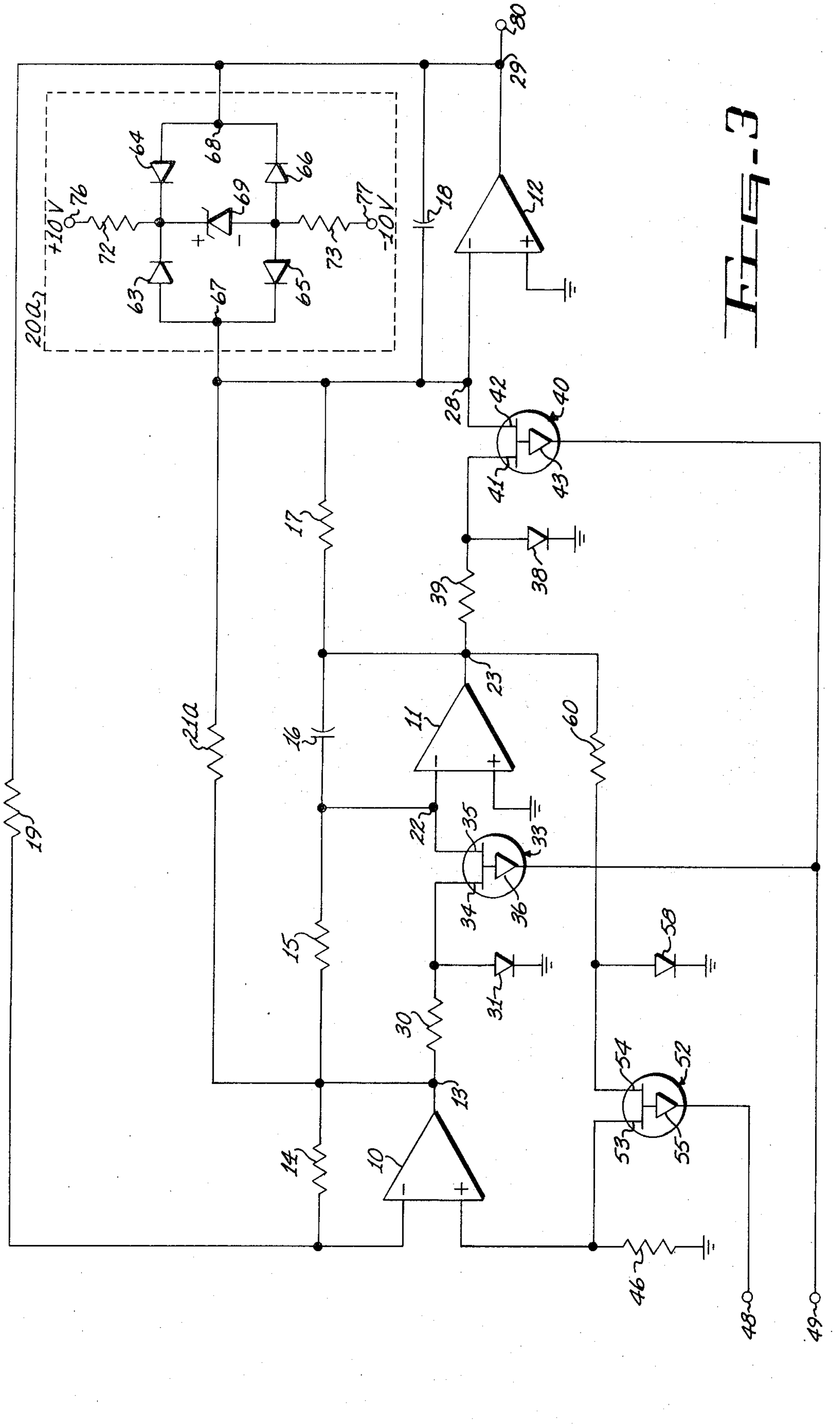
FIGS. 3 and 4 illustrate other circuit embodiments of the present invention.

The circuit disclosed in FIG. 3 includes a first degenerative feedback network **20*a* between junction points 29 and 28 and a regenerative feedback resistor 21*a* connected between junction points 28 and 13. The circuit also includes a second degenerative feedback circuit between junction points 23 and the positive input lead of amplifier 10. In the feedback network 20a resistors 72 and 73, zener diode 69 and the voltage at terminals 76 and 77 provide a reverse bias for diodes 63-66 until the voltage at junction point 29 is great enough to overcome the voltage drop across zener diode 69. Until the voltage at junction point 29 is great enough to overcome the voltage drop across the zener diode 69 there is no degenerative feedback between junction points 29 and 28 and the amplitude of the signal in the oscillator increases to a predetermined value. When the signal increases so that the positive signal voltage at junction point 29 is greater than the drop across zener diode 69 a current flows from junction point 29 through diodes 64, 69 and 65 to the junction point 28. This provides a degenerative feedback for the amplifier 12 on one half of the cycle of the signal. When the voltage is negative at junction point 29 current flows from junction point 28 through diodes 63, 69 and 66 to the junction point 29** thereby providing a degenerative feedback on the opposite half cycle.

The low frequency oscillator shown in FIG. 3 also provides means for switching the operating frequency of the oscillator by applying a switching voltage to the input terminal 49 and to a pair of switches or field effect transistors 33 and 40. A field-effect transistor is a semiconductor device having a first output electrode or "source," a second output electrode or "drain" and a gate. The field-effect transistor can be used as a resistive device with the value of resistance between the source and the drain depending upon the value of voltage applied to the gate. When a zero value of voltage is applied to the gate of a field-effect transistor the resistance between the source and the drain may be quite low, for example, it may be around 2 ohms. On the other hand, when a positive value of voltage is applied to the gate the value of resistance between the source and the drain may become quite high, for example, it may be as high as 2,000,000 ohms. A more detailed description of the field-effect transistor can be found on pages 658–662 of the textbook, " Pulse, Digital, and Switching Waveforms" by Millman M. Taub, published by the McGraw-Hill Book Company, New York, N.Y.

Field effect transistor 33 includes a source 34, a drain 35 and a gate 36. When there is a positive signal on input terminal 49 the field effect transistors 33 and 40 each have a high impedance between the source and the drain so that resistor 15 is the only impedance between junction points 13 and 22 and resistor 17 is the only impedance between junction points 23 and 28. Thus, resistors 15 and 17 determine the operating frequency of the oscillator. When a zero voltage signal is applied to terminal 49 the field effect transistors 33 and 40 are rendered conductive so that resistor 30 is in parallel with resistor 15 and resistor 39 is in parallel with resistor 17. The value of resistance between junction points 13 and 22 and the value of resistance between junction points 23 and 28 are reduced. This causes the frequency of the oscillation of the circuit of FIG. 3 to increase. If it is desired that the oscillator operate at more than two predetermined frequencies other field effect transistors and other resistors can be included in the circuit to provide an additional frequency of operation. Diodes 31 and 38 may be used to limit the voltage at the source 34 of field effect transistor 33 and at the source 41 of field effect transistor 40. When the voltage on the source is low a lower value of voltage on the gate will cause the field effect transistor to be rendered nonconductive. These diodes 31 and 38 may be omitted from the circuit if it is not desired to use a lower voltage at input terminal 49.

Resistors 46 and 60 and field effect transistor 52 provide a degenerative feedback which can be used to stop the circuit from oscillating when a signal is applied to input terminal 48. When there is a positive signal on terminal 48 the field effect transistor 52 is a high impedance circuit so there is no degenerative feedback and the circuit operates at the frequency which is determined by the components in the circuit. When a zero voltage signal is applied to terminal 48 the impedance of the field effect transistor 52 is low so that the degenerative feedback circuit is connected between junction point 23 and the positive input lead of amplifier 10, thereby preventing the circuit of FIG. 3 from oscillating.

Figure 4:
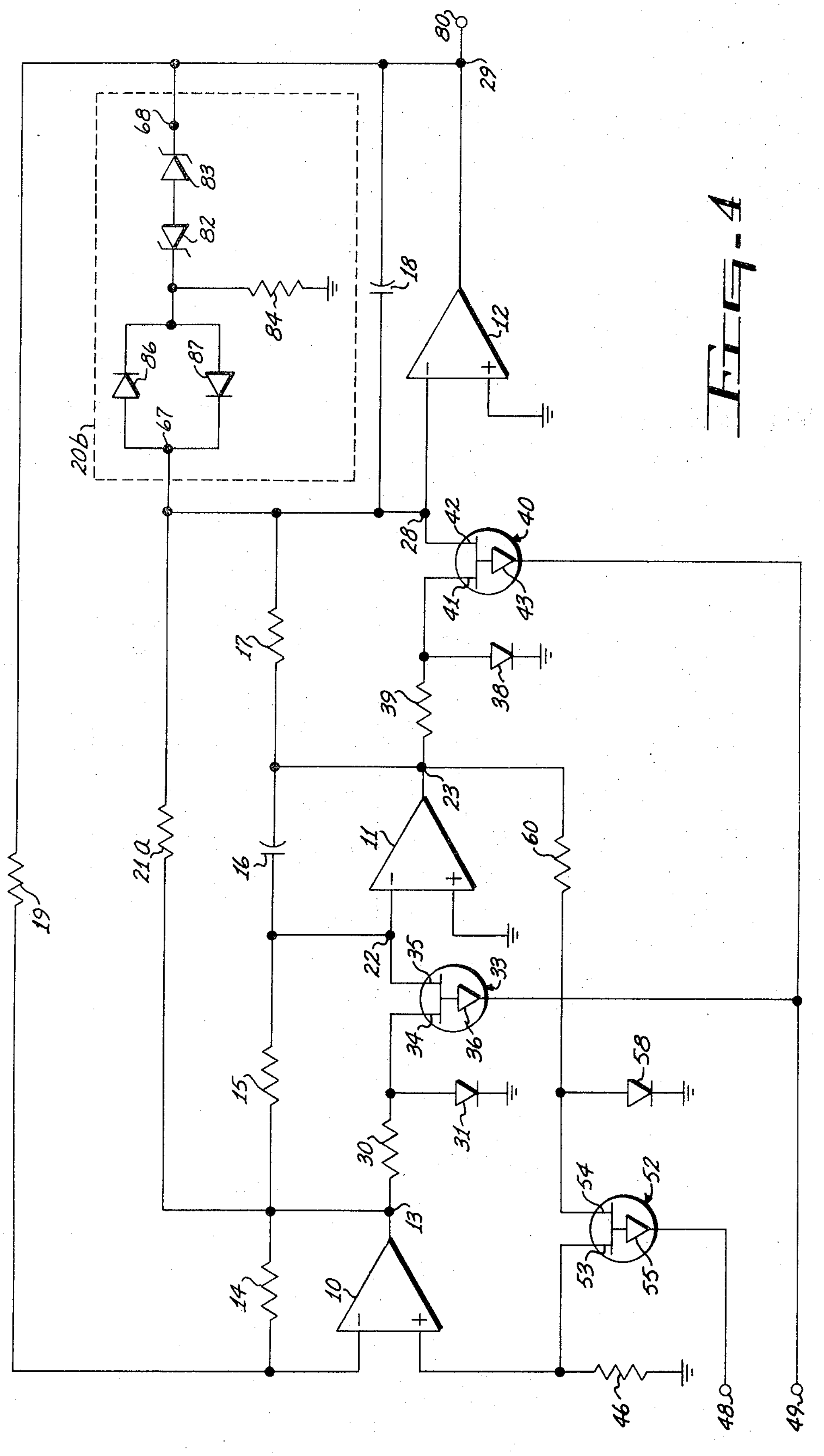

The circuits shown in FIGS. 3 and 4 can be used in a data communication system to convert binary signals into audio signals for transmission over the nation's telephone system to a distant location. For example, a binary zero applied to input terminal 49 causes resistors 30 and 39 to be connected and causes the oscillator to develop a 2225 hz signal. A binary one applied to terminal 49 causes the field effect transistors to be nonconductive so that resistors 15 and 17 cause the oscillator to develop a 2025 hz signal. A zero value of voltage on terminal 48 causes the oscillator to stop oscillating.

The circuit disclosed in FIG. 4 includes a degenerative feedback network 20*b* between junction points 29 and 28. When the signal at junction point 29 is low zener diodes 82 and 83 and diodes 86 and 87 provide a high impedance so that there is no degenerative feedback. When the signal at junction point 29 increases the zener diodes are rendered conductive so that a degenerative signal is coupled from junction point 29 to junction point 28. This degenerative signal limits the amplitude of the signal generated by the oscillator. The circuit connections of zener diodes 82 ane 83 in FIG. 4 may be reversed and the circuit will function in the same manner. The anode of zener diode 82 may be connected to the anode of diode 87. The cathode of zener diode 82 may be connected to the cathode of zener diode 83 and the anode of zener diode 83 may be connected to junction point 68.

While the principles of the invention have now been made clear in an illustrative embodiment, there will be many obvious modifications of the structure, proportions, materials and components without departing from those principles. The appended claims are intended to cover any such modifications.

What is claimed is:

1. A low frequency oscillator circuit comprising:

first, second and third amplifiers each having first and second input leads and an output lead;

first, second, third and fourth resistors, said first resistor being connected between said output lead of said second amplifier and said first input lead of said first amplifier, said second resistor being connected between said output lead of said third amplifier and said first input lead of said second amplifier, said third resistor being connected between said first input lead of said third amplifier and said output lead of said third amplifier, said fourth resistor being connected between said output lead of said first amplifier and said first input lead of said third amplifier;

first and second capacitors, said first capacitor being connected between said output lead of said first amplifier and said first input lead of said first amplifier, said second capacitor being connected between said output lead of said second amplifier and said first input lead of said second amplifier, said second input leads of each of said first, said second and said third amplifiers being coupled to ground; and first and second feedback networks, said first network being connected between said output lead of said third amplifier and said first input lead of said first amplifier, said second network being connected between said output lead of said first amplifier and said first input lead of said first amplifier.

2. A low frequency oscillator circuit as defined in claim 1 wherein said first network includes:

fifth and sixth resistors, said fifth resistor being connected between said output lead of said third amplifier and a first junction point, said sixth resistor being connected between said first junction point and said first input lead of said first amplifier; and first and second zener diodes each having an anode and a cathode, said cathode of said first zener diode being connected to said first junction point, said anode of said first zener diode being connected to said anode of said second zener diode, said cathode of said second zener diode being connected to ground.

3. A low frequency oscillator circuit as defined in claim 1 wherein said second network includes:

first, second, third and fourth diodes each having an anode and a cathode, said anode of said first diode and said cathode of said second diode each being connected to said first input lead of said first amplifier, said anode of said third diode and said cathode of said fourth diode each being connected to said output lead of said first amplifier;

a third zener diode having an anode and a cathode, said cathode of said third zener diode being connected to said cathodes of said first and said third diode, said anode of said third zener diode being connected to said anodes of said second and said fourth diodes;

first and second reference potentials; and seventh and eighth resistors, said seventh resistor being connected between said first potential and said cathode of said third zener diode, said eighth resistor being connected between said second potential and said anode of said third zener diode.

4. A low frequency oscillator circuit as defined in claim 1 wherein said second network includes:

fifth and sixth diodes each having an anode and a cathode, said anode of said fifth diode and said cathode of said sixth diode each being connected to said first input lead of said first amplifier;

fourth and fifth zener diodes each having an anode and a cathode, said cathode of said fourth zener diode being connected to said output lead of said first amplifier, said anode of said fourth zener diode being connected to said anode of said fifth zener diode, said cathode of said fifth zener diode being connected to said anode of said sixth diode and to said cathode of said fifth diode; and a ninth resistor, said ninth resistor being connected to between ground and said cathode of said fifth zener diode.

5. A low frequency oscillator circuit as defined in claim 1 including:

first and second switches;

tenth and eleventh resistors, one end of said tenth resistor being connected to said output lead of said third amplifier, said first switch being connected between said first input lead of said second amplifier and a second end of said tenth resistor, one end of said eleventh resistor being connected to said output lead of said second amplifier, said second switch being connected between said first input lead of said first amplifier and a second end of said eleventh resistor; and means for operating said first and said second switches, said means for operating being coupled to said first and to said second switches.

6. A low frequency oscillator circuit as defined in claim 1 including:

first and second field effect transistors each having a source, a drain and a gate;

tenth and eleventh resistors, said tenth resistor being connected between said output lead of said third amplifier and said source of said first transistor, said drain of said first transistor being connected to said input lead of said second amplifier, said eleventh resistor being connected between said output lead of said second amplifier and said source of said transistor, said drain of said transistor being connected to said input lead of said first amplifier; and a first signal input terminal, said first input terminal being coupled to said gates of said first and said second transistor.

7. A low frequency oscillator circuit as defined in claim 5 wherein said first and said second networks include:

fifth and sixth resistors, said fifth resistor being connected between said output lead of said third amplifier and said first input lead of said first amplifier;

fifth and sixth diodes each having an anode and a cathode, said anode of said fifth diode and said cathode of said sixth diode each being connected to said first input lead of said first amplifier; and fourth and fifth zener diodes each having an anode and a cathode, said cathode of said fourth zener diode being connected to said output lead of said first amplifier, said anode of said fourth zener diode being connected to said anode of said fifth zener diode, said cathode of said fifth zener diode being connected to said anode of said sixth diode and to said cathode of said fifth diode, said sixth resistor being connected between ground and said cathode of said fifth zener diode.

8. A low frequency oscillator circuit as defined in claim 5 wherein said first and said second networks include:

fifth, sixth and seventh resistors, said fifth resistor being connected between said output lead of said third amplifier and a first junction point, said sixth resistor being connected between said first junction point and said first input lead of said first amplifier, said seventh resistor being connected between said output lead of said first amplifier and said input lead of said first amplifier; and first and second zener diodes each having an anode and a cathode, said cathode of said first zener diode being connected to said first junction point, said anode of said first zener diode being connected to said anode of said second zener diode, said cathode of said zener diode being connected to ground.

9. A low frequency oscillator circuit as defined in claim 6 wherein said first and said second networks include:

fifth, sixth and seventh resistors, said fifth resistor being connected between said output lead of said third amplifier and said first input lead of said first amplifier;

first, second, third and fourth diodes each having an anode and a cathode, said anode of said first diode and said cathode of said second diode each being connected to said first input lead of said first amplifier, said anode of said third diode and said cathode of said fourth diode each being connected to said output lead of said first amplifier; a zener diode having an anode and a cathode, said cathode of said zener diode being connected to said cathodes of said first and said third diodes, said anode of said zener diode being connected to said anodes of said second and said fourth diodes; and first and second reference potentials, said sixth resistor being connected between said second potential and said anode of said zener diode, said seventh resistor being connected between said first potential and said cathode of said zener diode.

10. A low frequency oscillator circuit as defined in claim 6 wherein said first and said second networks include:

fifth, sixth and seventh resistors, said fifth resistor being connected between said output lead of said third amplifier and said first input lead of said first amplifier;

first, second, third and fourth diodes each having an anode and a cathode, said anode of said first diode and said cathode of said second diode each being connected to said first input lead of said first amplifier, said anode of said third diode and said cathode of said fourth diode each being connected to said output lead of said first amplifier; a zener diode having an anode and a cathode, said cathode of said zener diode being connected to said cathodes of said first and said third diodes, said anode of said zener diode being connected to said anodes of said second and said fourth diodes; and first and second reference potentials, said sixth resistor being connected between said second potential and said anode of said zener diode; said seventh resistor being connected between said first potential and said cathode of said zener diode; and wherein said oscillator circuit includes:

a third field effect transistor having a source, a drain and a gate, said source of said third transistor being coupled to said second input lead of said third amplifier, said drain of said third transistor being coupled to said output lead of said second amplifier; and a second signal input terminal, said second input terminal being coupled to said gate of said third transistor.

* * * * *